(12) United States Patent
Nozawa et al.

(10) Patent No.: US 7,372,159 B2
(45) Date of Patent: May 13, 2008

(54) SEMICONDUCTOR DEVICE

(75) Inventors: Toshiya Nozawa, Ryuo (JP); Masahito Mitsui, Ryuo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/811,973

(22) Filed: Mar. 30, 2004

(65) Prior Publication Data
US 2004/0188847 A1 Sep. 30, 2004

(30) Foreign Application Priority Data
Mar. 31, 2003 (JP) .......................... P2003-093230

(51) Int. Cl.
*H01L 23/08* (2006.01)
(52) U.S. Cl. .............................. 257/762; 257/E23.192
(58) Field of Classification Search ................ 257/762
See application file for complete search history.

(56) References Cited

U.S. PATENT DOCUMENTS

| | | | | |
|---|---|---|---|---|
| 3,723,835 A | * | 3/1973 | Davis et al. ................ | 257/794 |
| 4,042,951 A | * | 8/1977 | Robinson et al. ........... | 257/794 |
| 4,742,377 A | * | 5/1988 | Einthoven ................... | 257/484 |
| 5,372,886 A | * | 12/1994 | Inazawa et al. ............. | 428/384 |
| 5,532,434 A | * | 7/1996 | Takeno et al. .......... | 174/110 R |
| 6,137,211 A | * | 10/2000 | Sugimoto et al. ........... | 313/145 |
| 6,344,790 B1 | * | 2/2002 | Ochi et al. .............. | 338/22 SD |

FOREIGN PATENT DOCUMENTS

JP  6-112386  4/1994

* cited by examiner

*Primary Examiner*—Evan Pert
*Assistant Examiner*—Ben P Sandvik
(74) *Attorney, Agent, or Firm*—Antonelli, Terry, Stout & Kraus, LLP.

(57) ABSTRACT

A glass-sealed type semiconductor device has Dumet electrodes, a glass sealing member, and a semiconductor element tightly sealed in a cavity constituted by the Dumet electrodes and the glass sealing member. The semiconductor element is constituted by a Schottky barrier diode. External leads serving as external terminals of the semiconductor device are connected to the Dumet electrodes, respectively. The Dumet electrodes have core portions comprised of a nickel-iron alloy, copper layer formed on the outer peripheries of the core portions, and copper oxide layers formed on the outer surfaces of the copper layers, respectively. The ratios of the copper layers are 20 wt % or more each.

9 Claims, 14 Drawing Sheets

FIG. 10

| Characteristics | | | Glass material $G_1$ | Glass material $G_2$ (low-melting-point glass) |
|---|---|---|---|---|
| Coefficient of thermal expansion | 30~380°C | $\times 10^{-7}$/K | 91 | 88 |
| Concentration | | $\times 10^3$ kg/m$^3$ | 4.31 | 4.47 |
| Distortion point | | °C | 390 | 395 |
| Slow cooling point | | °C | 430 | 430 |
| Softening point | | °C | 575 | 552 |
| Adhesive sealing temperature | | °C | 655 | 620 |
| Working temperature | | °C | 820 | 760 |
| Volume resistivity (log $\rho$) | 150°C | $\Omega \cdot$cm | 14.8 | 14.5 |
| | 250°C | $\Omega \cdot$cm | 11.7 | 11.5 |
| Dielectric constant | 1MHz, 25°C | | 9.5 | 9.9 |
| tan $\delta$ | 1MHz, 25°C | $\times 10^{-4}$ | 8 | 7 |
| Tone | | | Transparence | Transparence |
| Composition | | | $K_2O \cdot PbO \cdot SiO_2$ | $K_2O \cdot PbO \cdot SiO_2$ |
| Na$_2$O content | | wt.% | <0.1 | <0.1 |

FIG. 11

|  | Dumet electrodes 2 and 3 | Dumet electrode $D_{ce}$ of comparative example |
|---|---|---|
| Ratio of copper layer 12 (wt%) | 20~25 | 14~19 |
| Ni content in core portion 11 (wt%) | 41~43 | 46~48 |

US 7,372,159 B2

SEMICONDUCTOR DEVICE

CROSS-REFERENCE TO RELATED APPLICATION

The present application claims priority from Japanese Patent Application No. JP2003-93230 filed on Mar. 31, 2003, the content of which is hereby incorporated by reference into this application.

TECHNICAL FIELD OF THE INVENTION

The present invention relates to a semiconductor device and, more particularly, to a technique which is effectively applied to a glass-sealed type semiconductor device.

BACKGROUND OF THE INVENTION

Japanese Patent Application Laid-Open No. 6-112386 describes a technique related to diode parts having the following structure. That is, two slug leads each of which is obtained by junction of a CP line used as an external lead to a Dumet wire used as an internal lead are prepared, and the Dumet wires of the two slug leads are inserted into the cylinders of cylindrical sealing members (glass sleeves) consisting of a glass material from both the ends of the cylinder, and a single diode is sealed in a cavity formed by the Dumet wires and the sealing material.

SUMMARY OF THE INVENTION

According to the studies by the present inventors, in a glass-sealed type semiconductor device, it was found that high-temperature glass sealing causes various defects. For example, in a glass-sealed type Schottky barrier diode, a metal electrode in the Schottky barrier diode reacts to a silicon semiconductor region in glass sealing to cause a silicide layer to be formed, and a backward leakage current may be increased. This decreases a manufacturing yield of semiconductor devices and increases the manufacturing cost of the semiconductor devices. In a switching diode using a PN junction, a zener diode, or the like, high-temperature glass sealing increases compression stress or tensile stress, the reliability of an electric connection between the diode and the Dumet electrode which are sealed may be deteriorated. This decreases the manufacturing yield of semiconductor devices and increases the manufacturing cost of the semiconductor devices.

For this reason, in the glass-sealed semiconductor device, a glass sealing temperature is desired to be minimized. However, it was found that, when the glass sealing temperature is decreased by using a low-melting-point glass, adhesion properties between the glass and a Dumet wire serving as an internal electrode is deteriorated. This may cause the deterioration of the reliability of the glass-sealed type semiconductor device to deteriorate the manufacturing yield and to increase the manufacturing cost of semiconductor devices.

It is an object of the present invention to provide a semiconductor device the reliability of which can be improved.

It is another object of the present invention to provide a semiconductor device the manufacturing cost of which can be reduced.

The object, the other object, and novel characteristic features will be apparent from the description of the specification and the accompanying drawings.

The outline of typical one of the aspects of the invention disclosed in this application will be briefly described below.

In the semiconductor device according to the present invention, a glass-sealed type semiconductor device is formed by using a Dumet wire in which the ratio of a layer (copper layer) containing copper as a main component is not less than 20 wt %.

BRIEF DESCRIPTIONS OF THE DRAWINGS

FIG. 10 is a diagram for explaining the characteristics of glass used in a glass sealing member;

FIG. 11 is a diagram for explaining a ratio of a copper layer of a Dumet electrode used in the semiconductor device according to an embodiment of the present invention and a nickel content of the core portion of the Dumet electrode;

DESCRIPTION OF THE PREFERRED EMBODIMENTS

Figure 1:
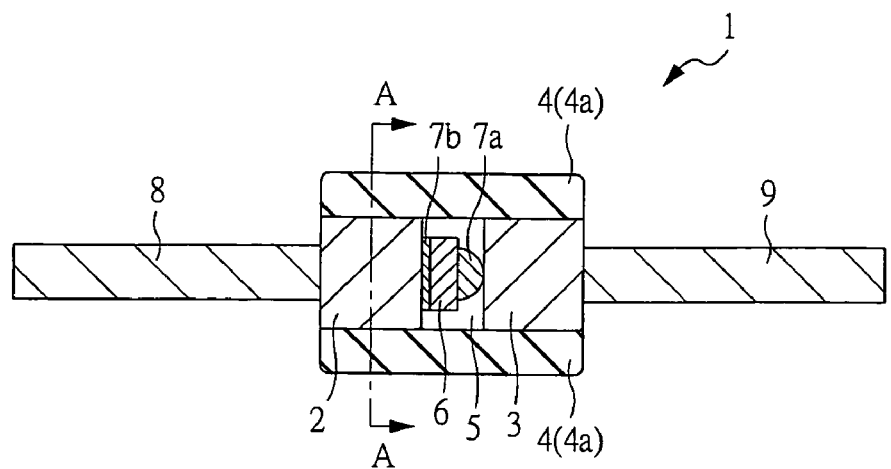
FIG. 1 is a sectional view showing the structure of a semiconductor device according to an embodiment of the present invention.

In the following embodiments, if necessary for convenience, a description will be made in a plurality of sections or embodiments. However, unless otherwise stated, these sections or embodiments are not related to each other, and one of the sections or embodiments is a modification, details, a supplementary explanation, or the like of some or all of the other sections or embodiments.

In the following embodiments, when the number of elements or the like (including the number of parts, a numerical value, quantity, a range, and the like) are mentioned, unless otherwise stated or unless the number of elements and the like are apparently limited to specific numbers in principle, the number of elements and the like are not limited to specific numbers and may be the specific numbers or more or less.

In the following embodiments, the constituent elements (including element steps or the like), unless otherwise stated or unless the constituent elements are apparently necessary in principle, the constituent elements are not always necessary as a matter of course.

In the following embodiments, when the shapes of constituent elements or the like, positional relationships, and the like are mentioned, unless otherwise stated or unless the shapes, the positional relationship, and the like are apparently wrong in principle, it is assumed that the shapes and the like substantially include approximate or similar shapes or the like. This can be similarly applied to the numerical values and the range.

The same reference numerals as in all the drawings for explaining the embodiments denote parts having the same functions in the drawings, and an explanation thereof will not be repeated. In the following embodiment, unless a special explanation is necessary, an explanation of the same parts or similar parts will not be repeated.

In the drawings used in this embodiment, hatching may be applied to even a plan view to make it easy to see the plan view. In addition, hatching may be omitted even in a sectional view to make it easy to see the sectional view.

The embodiments of the present invention will be described below with reference to the accompanying drawings.

Embodiment 1

A semiconductor device according to this embodiment will be described below with reference to the drawings. FIG. 1 is a sectional view showing the structure of a semiconductor device according to an embodiment of the present invention.

A semiconductor device 1 shown in FIG. 1 is a glass-sealed type semiconductor device, for example a glass-sealed type diode. As shown in FIG. 1, the semiconductor device 1 includes electrodes constituted by Dumet wires, i.e., Dumet electrodes 2 and 3, a glass sealing member (glass tube or glass sleeve) 4, and a semiconductor element 6 (semiconductor chip) airtightly sealed (enclosed or airproof sealed) in a cavity 5 constituted by the Dumet electrodes 2 and 3 and the glass sealing member 4.

The glass sealing member 4 has a tubular (cylindrical) shape. The Dumet electrode 2 and the Dumet electrode 3 are arranged to face each other through the semiconductor element 6. The Dumet electrodes 2 and 3 and the semiconductor element 6 interposed therebetween are inserted into the tubular glass sealing member 4. With heating in the glass sealing step, the glass sealing-member 4 is fused on the outer peripheral surfaces of the Dumet electrodes 2 and 3. Therefore, the Dumet electrode 2, the semiconductor element 6, and the Dumet electrode 3 are sealed by the glass sealing member 4.

The semiconductor element 6 is a diode such as a Schottky barrier diode (Schottky diode), one of the cathode and the anode is electrically connected to the Dumet electrode 2, and the other of the cathode and the anode is electrically connected to the Dumet electrode 3. A bump electrode 7a comprised of silver (Ag) or the like is formed on one major surface (upper surface) of the semiconductor element 6 as one electrode of the cathode and the anode, and a back side electrode 7b is formed on the other major surface (lower surface) as the other electrode of the cathode and the anode. The bump electrode 7a of the semiconductor element 6 is electrically connected to the Dumet electrodes 2 and 3, and the back side electrode 7b of the semiconductor element 6 is electrically connected to the Dumet electrode 2.

An external lead 8 is connected to the Dumet electrode 2, and an external lead 9 is connected to the Dumet electrodes 3. The external leads 8 and 9 are constituted by core lines containing, e.g., copper and iron as main components. As described above, the Dumet electrodes 2 and 3 are connected to the semiconductor element 6 (the bump electrode 7a and the back side electrode 7b thereof) in the glass sealing member 4, and can function as internal electrodes (internal leads or internal terminals) of the semiconductor device 1. The external leads 8 and 9 are exposed from the glass sealing member 4, and can function as external electrodes (external terminals) of the semiconductor device 1. For example, when the semiconductor device 1 is mounted on a wiring board (not shown), the external lead 8 and 9 are connected to the wiring pattern on the wiring board by using soldering or the like.

Figure 2:
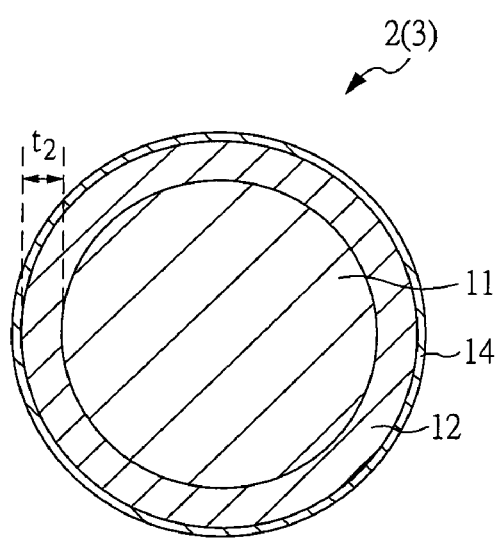
FIG. 2 is a sectional vide of a Dumet electrode.

FIG. 2 is a sectional view of the Dumet electrodes 2 and 3. The Dumet electrode 2 and the Dumet electrode 3 have cylindrical shapes, and have the same shapes and the same configurations, respectively. The sectional view in FIG. 2 corresponds to the section of the Dumet electrode 2 along an A-A line in FIG. 1, and the section of the Dumet electrode 3 is the same as that in FIG. 2.

The Dumet electrodes 2 and 3 are constituted by Dumet wires, respectively. The Dumet electrodes 2 and 3 are obtained by cutting, e.g., relatively long Dumet wires into lines having predetermined lengths. As shown in FIG. 2, each of the Dumet electrodes 2 and 3 has a cylindrical core portion (core material, center layer, or core line) 11 and a coating layer (copper layer 12) formed on the outer periphery (side surface) of the cylindrical core portion 11. The cylindrical core portions 11 of the Dumet electrodes 2 and 3 comprise a nickel-containing alloy such as an alloy (iron-nickel alloy) containing, e.g., iron and nickel as main components. Each of the Dumet electrodes 2 and 3 has a layer containing copper as a main component, i.e., a copper layer 12 as a coating layer for the core portion 11. In this embodiment, the copper layer 12 is a layer containing copper as a main component. It is assumed that the copper layer 12 may slightly contain a component except for copper as an impurity. A copper oxide layer 14 comprised of a copper-oxide ($Cu_2O$) or the like is formed on the outer surface of the copper layer 12. In this embodiment, as will be described later, the Dumet electrode 2 and the Dumet electrode 3 constituted by Dumet wires include the copper layers 12 at ratios of 20 wt % or more.

The semiconductor element 6 is arranged on the core portion 11 of the Dumet electrode 2. Since the semiconductor element 6 is arranged on the core portion 11 the coefficient of thermal expansion of which is relatively approximate to that of the semiconductor element 6, the reliability of the electric connection between the semiconductor element 6 and the Dumet electrodes 2 and 3 can be improved. The copper layer 12 is formed as a coating layer on the outer periphery of the core portion 11, so that the coefficients of thermal expansion of the Dumet electrodes 2 and 3 and the glass material (glass sealing member 4) are matched with each other to make the glass sealing easy. In cooling after the glass sealing, the glass (glass sealing member 4) can be prevented from being cracked. Since the copper oxide layer 14 is formed as the outermost layer, so that the adhesive strength between the Dumet electrodes 2 and 3 and the glass sealing member 4 can be more improved. For example, the copper oxide layer 14 is also fused together with the glass sealing member 4 in the glass sealing and then cooled, so that the adhesive strength between the Dumet electrodes 2 and 3 and the glass sealing member 4 can be more improved.

The steps in manufacturing the semiconductor device 1 will be described below. The steps in manufacturing the semiconductor element (semiconductor chip) 6 will be described below. FIGS. 3 to 6 are main sectional views of the steps in manufacturing the semiconductor element 6.

Figure 3:
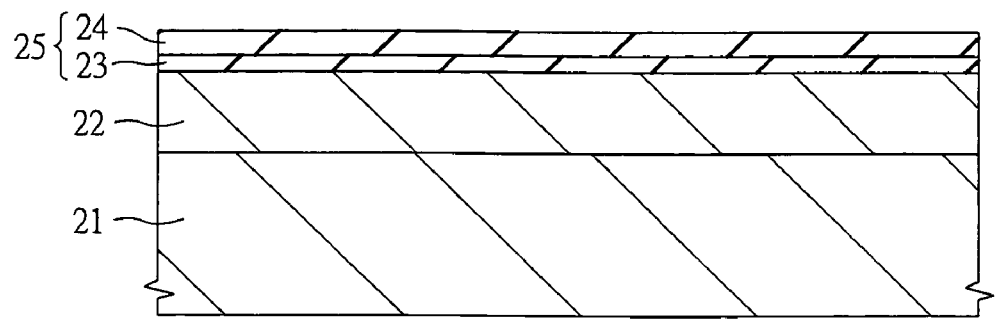
FIG. 3 is a main sectional view of a step in manufacturing a semiconductor element used in the semiconductor device according to an embodiment of the present invention.

As shown in FIG. 3, a semiconductor substrate (semiconductor wafer) 21 comprised of $n^+$-type silicon in which an impurity (for example, arsenic (As) or phosphor (P)) having an n-type conductivity is doped at a high concentration (for example, about $1 \times 10^{20}$ atoms/cm$^3$) is prepared. An epitaxial layer (epitaxial silicon layer) 22 having an n-type conductivity is formed on the semiconductor substrate 21 by using a vapor-phase growth (epitaxial growth). An impurity (for example, arsenic (As) or phosphor (P)) having an n-type conductivity is doped in the epitaxial layer 22. The film thickness of the epitaxial layer 22 is, e.g., about several μm. The n-type impurity concentration contained in the epitaxial layer 22 is, e.g., about $1 \times 10^{15}$ atoms/cm$^3$.

A silicon oxide layer 23 is formed on the upper surface of the epitaxial layer 22 by using a thermal oxidizing method. A PSG (Phosphor Silicate Glass) film 24 is deposited on the silicon oxide layer 23 by using a CVD (Chemical Vapor Deposition) method or the like. In this manner, a surface protecting film 25 constituted by the silicon oxide layer 23 and the PSG film 24 is formed. With the above processes, the structure shown in FIG. 3 can be obtained.

Figure 4:
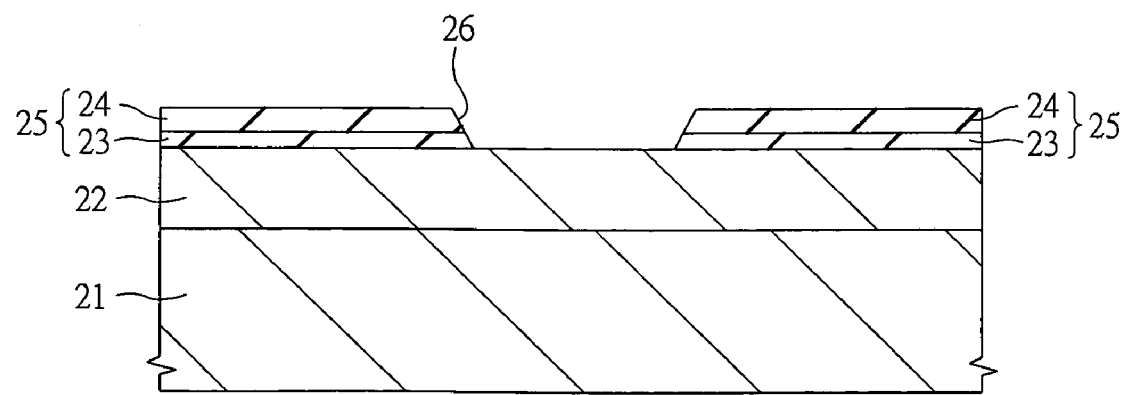
FIG. 4 is a main sectional view of a step in manufacturing the semiconductor element subsequent to the step in FIG. 3.

As shown in FIG. 4, the surface protecting film 25 is dry-etched by using, as an etching mask, a photoresist pattern (not shown) formed by-photolithography technique to form an opening 26 reaching the epitaxial layer 22. The bottom area (bottom shape) of the opening 26 can be selected as needed. For example, the bottom can have a planar circular shape having a diameter of, e.g., about several μm to several ten μm.

Figure 5:
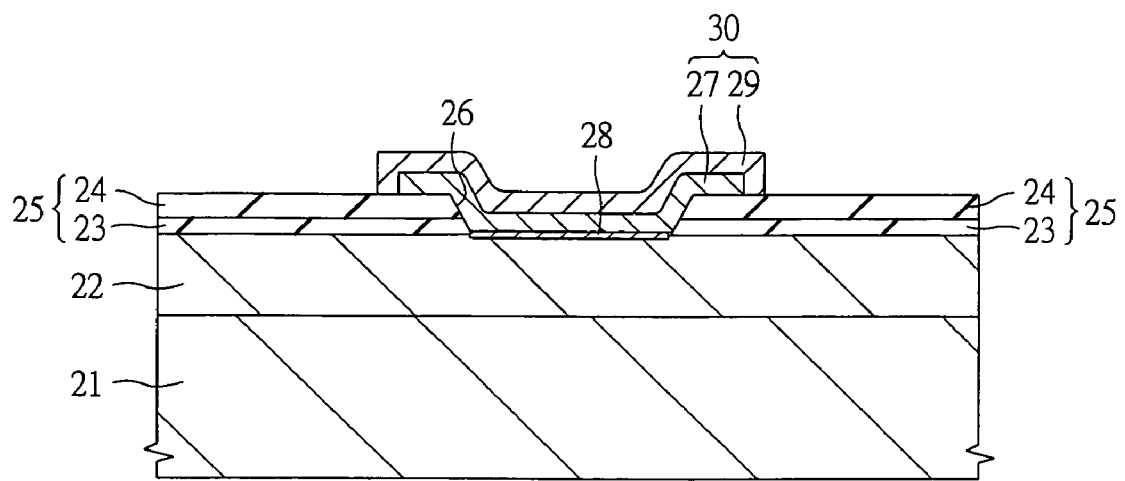
FIG. 5 is a main sectional view of a step in manufacturing the semiconductor element subsequent to the step in FIG. 4.

As shown in FIG. 5, a metal film 27 comprised of, e.g., tungsten (W) is formed on the surface protecting film 25 including the inside of the opening 26. The metal film 27 can be formed by using, e.g., a sputtering method or the like. As the method of forming the metal film 27, a CVD method or the like can be applied. As the material of the metal film 27, a metal material having a work function depending on the size of a Schottky barrier to be formed can be selected. In addition to tungsten (W) described above, titanium (Ti), chromium (Cr), silver (Ag), palladium (Pd), or the like can be used. The film growing temperature of the metal film 27 is, e.g., about 200 to 300° C.

Thermal treatment is performed to the resultant structure to react the metal film 27 and the epitaxial layer 22 to each other, so that a thin silicide (tungsten-silicide) layer 28 is formed on the interface between the metal film 27 and the epitaxial layer 22. The thermal treatment for silicification can be performed at a temperature falling within the range of, e.g., 400 to 600° C. When the temperature of the thermal treatment is increased, silicification is enhanced, and the film thickness of the silicide layer 28 can be increased. When the silicification is excessively enhanced (the silicide layer 28 is excessively thick), a backward current (leakage current) of a Schottky diode to be formed increases. When the silicification is excessively poor (the silicide layer 28 is excessively thin), a backward current (leakage current) of the Schottky diode to be formed increases. For this reason, a thermal treatment temperature is set for silicification depending on requested diode characteristics to control the degree of silicification, so that the characteristic values of a diode to be manufactured can be controlled to desired values. The reaction of silicification on the bottom of the metal film 27 can occur in not only the thermal treatment step for silicification but also various steps performed at a relative high temperature, e.g., the steps of forming the metal film 27 and other material films.

The metal film 27 is patterned by dry etching using, as an etching mask, a photoresist pattern (not shown) formed by photolithography technique.

A metal film 29 comprised of, e.g., chromium (Cr) or the like is formed on the surface protecting film 25 including the upper surface of the metal film 27. The metal film 29 is formed by using, e.g., a sputtering method. As another material of the metal film 29, aluminum (Al) or the like can also be used. The film forming temperature of the metal film 29 falls within the range of, e.g., about 200 to 300° C. The metal film 29 is patterned by dry etching using, as an etching mask, a photoresist pattern (not shown) formed by photolithography technique. In this manner, a metal electrode (anode electrode) 30 constituted by the metal film 27 and the metal film 29 and being in contact with the epitaxial layer 22 at the bottom of the opening 26. If the metal film 29 is unnecessary, the formation of the metal film 29 can be omitted. A Schottky barrier (Schottky junction) is formed between the metal electrode 30 (the metal film 27 thereof) and the epitaxial layer 22 due to a difference between the work functions of the metal film 27 and the epitaxial layer 22. In this manner, the structure in FIG. 5 can be obtained.

Figure 6:
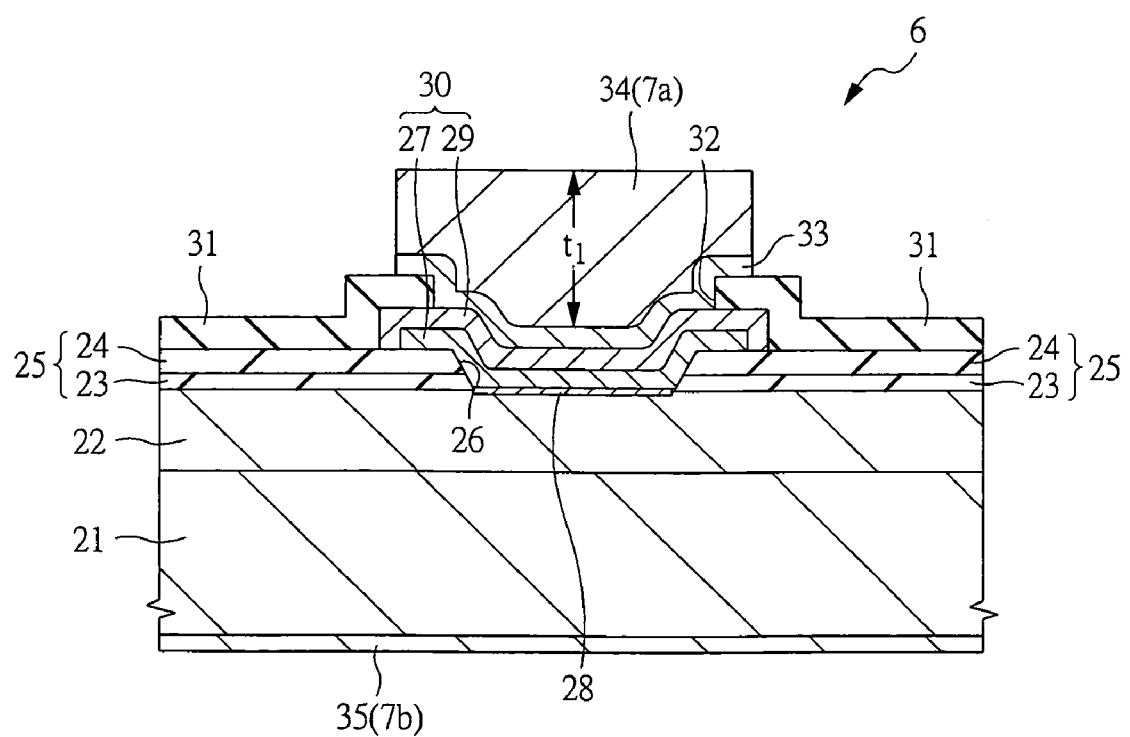
FIG. 6 is a main sectional view of a step in manufacturing the semiconductor element subsequent to the step in FIG. 5.

As shown in FIG. 6, a silicon nitride film and a silicon oxide film are sequentially deposited on the semiconductor substrate 21 to form a surface final protecting film 31. The surface final protecting film 31 is dry-etched by using, as an etching mask, a photoresist pattern (not shown) formed by photolithography technique to form an opening 32 reaching the metal electrode 30.

A titanium (Ti) film and a nickel (Ni) film are sequentially deposited on the semiconductor substrate 21 from the bottom to form a bump electrode underlying film 33. At this time, a palladium (Pd) film or the like may be deposited in place of the nickel film. A photoresist film (not shown) is coated on the bump electrode underlying film 33, and an opening corresponding to the bump electrode forming region is formed in the photoresist film by photolithography. A nickel (Ni) film, a copper (Cu) film, a silver (Ag) film, or the like are deposited on the bump electrode forming region by, e.g., a plating method to form a bump electrode 34

(corresponding to the bump electrode 7a). Thereafter, after the photoresist film used for forming the bump electrode 34 is removed, the bump electrode underlying film 33 is removed by wet etching using, e.g., a potassium hydroxide solution or an ammonium iodide solution such that the bump electrode underlying film 33 serving as the lower part of the bump electrode 34 is left. In this manner, the bump electrode 34 is formed on the metal electrode 30 exposed from the opening 32. The thickness (height) $t_1$ of the bump electrode 34 on the metal electrode 30 is, e.g., about 25 μm.

The lower surface of the semiconductor substrate 21 is ground as needed to thin the semiconductor substrate 21. After the lower surface of the semiconductor substrate 21 is wet-etched, the semiconductor substrate 21 is washed. Thereafter, a conductive material (metal material) is deposited on the lower surface of the semiconductor substrate 21 by using, e.g., a sputtering method or the like to form a back side electrode (corresponding to a cathode electrode, i.e., the back side electrode 7b) 35. The back side electrode 35 is constituted by, e.g., a silver (Ag) film. The film forming temperature of the back side electrode 35 falls within the range of about 200 to 300° C. Thereafter, as needed, the semiconductor substrate 21 is cut (diced) and separated into independent semiconductor elements (semiconductor chips) to form a semiconductor element (semiconductor chip) 6 serving as a Schottky barrier diode.

Figure 7:
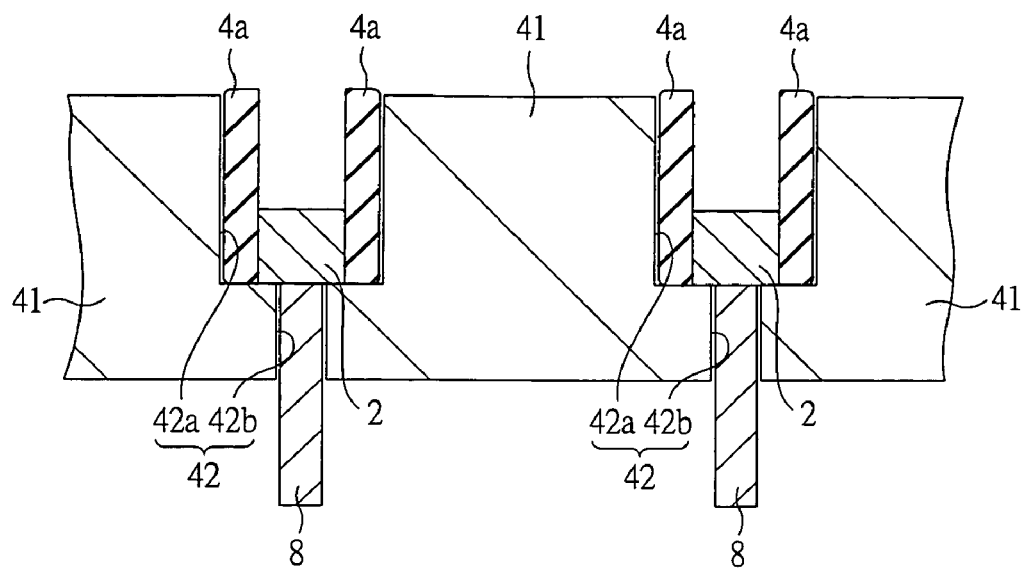
FIG. 7 is a diagram for explaining a step in manufacturing the semiconductor device according to an embodiment of the present invention.
Figure 8:
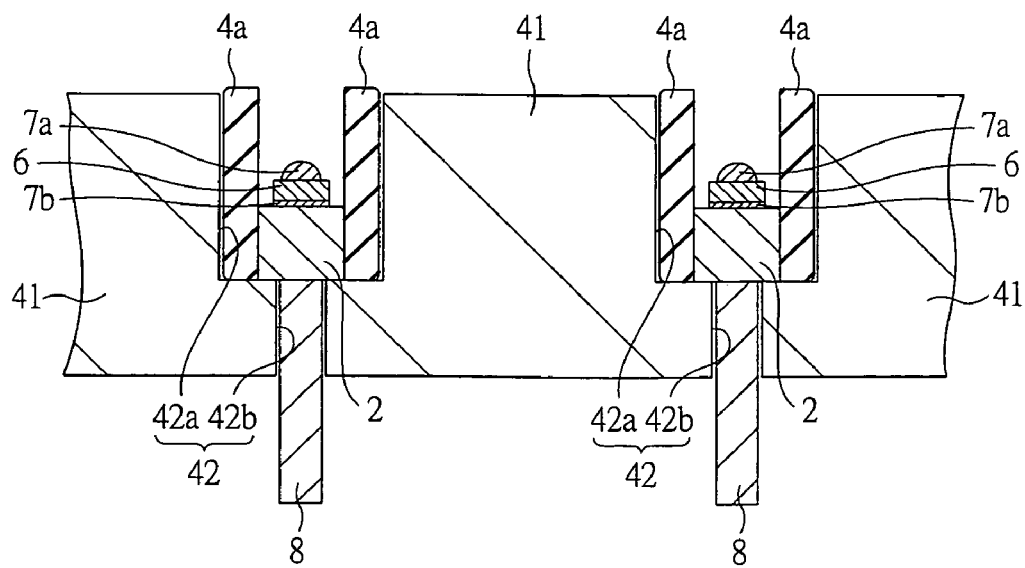
FIG. 8 is a diagram for explaining a step in manufacturing the semiconductor device subsequent to the step in FIG. 7.
Figure 9:
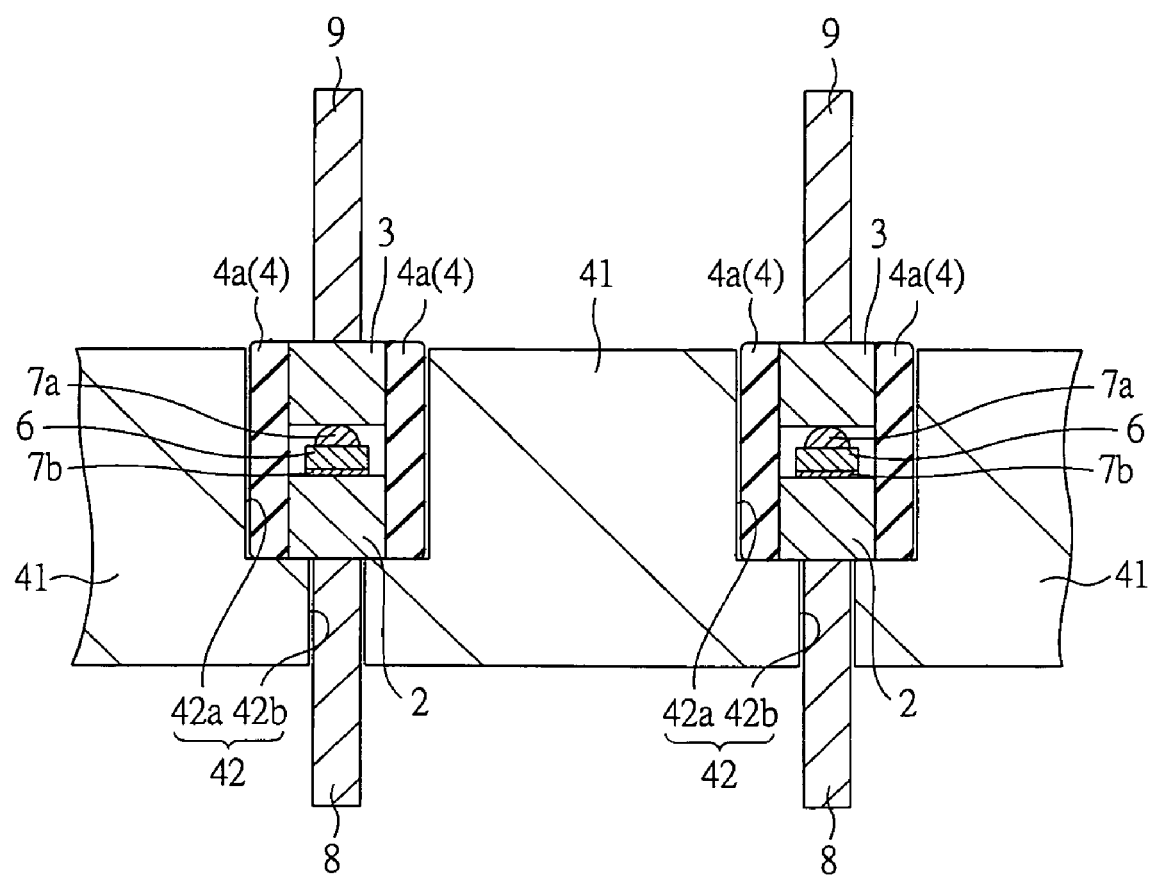
FIG. 9 is a diagram for explaining a step in manufacturing the semiconductor device subsequent to the step in FIG. 8.

The semiconductor device 1 will be manufactured as described below by using the semiconductor element 6 manufactured as described above. FIGS. 7 to 9 are explanatory views (sectional views) of steps in manufacturing the semiconductor device 1.

A relatively long Dumet wire for forming the Dumet electrodes 2 and 3 is cut by, e.g., a diamond cutter or the like into Dumet wires having predetermined lengths to form the Dumet electrodes 2 and 3. Therefore, the Dumet electrodes 2 and 3 are constituted by Dumet wires and have cylindrical shapes. The external lead 8 is connected (welded) at the center position of an end face (single side, cross section, or flat surface) of the Dumet electrode 2 or near the center position, and the external lead 9 is connected (welded) at a the center position of an end face (single side or cross section) of the Dumet electrodes 3 or near the center position. For example, when arc welding or spot welding is used, the external leads 8 and 9 can be connected (welded) to the Dumet electrodes 2 and 3. After the external lead 8 (external lead 9) is connected (welded) to the cross section of the Dumet wire for forming the Dumet electrodes 2 and 3, the Dumet wire is cut to make it possible to form the Dumet electrode 2 (Dumet electrode 3) to which the external lead 8 (external lead 9) is connected (welded).

Glass sealing is performed by using an assembling jig 41. As shown in FIG. 7, a plurality of circular grooves (hole) 42 in the form of a grating on the upper surface of the assembling jig 41. The grooves 42 are constituted by grooves (holes) 42a formed in the upper surface of the assembling jig 41 and having relatively large diameter and grooves 42b (holes) formed in the bottoms of the grooves 42a and having relatively small diameters. As described above, the Dumet electrode 2 to which the external lead 8 is connected is inserted (put) into each of the grooves 42 of the assembling jig 41 such that the Dumet electrode 2 faces upward (the external lead 8 faces downward). When each of the diameters of the grooves 42b is made smaller than the diameter of the Dumet electrode 2 and larger than the diameter of the external lead 8, only the external lead 8 is inserted into each of the grooves 42b, and the Dumet electrode 2 is fixed to the bottom of each of the grooves 42a.

A glass tube (glass sleeve) 4a serving as the glass sealing member 4 may be put (inserted) into each of the grooves 42 (grooves 42a) of the assembling jig 41 to fit the Dumet electrode 2 in the hole of the glass tube 4a. Alternatively, after putting the glass tube 4a into the groove 42 of the assembling jig 41, the Dumet electrode 2 to which the external lead 8 is connected may be put into each of the grooves 42 (grooves 42a) to fit the Dumet electrode 2 in the hole of the glass tube 4a).

As shown in FIG. 8, the semiconductor element 6 manufactured as described above is put in each of the grooves 42 (grooves 42a) of the assembling jig 41. In this manner, the semiconductor element 6 is arranged on the Dumet electrode 2 in the hole of the glass tube 4a. At this time, any one of the upper surface (surface on which the bump electrode 7a (bump electrode 34) is formed) and the lower surface (surface on which the back side electrode 7b (back side electrode 35) is formed) may face upward. As shown in FIG. 9, the Dumet electrode 3 to which the external lead 9 is connected is inserted (put) into each of the grooves 42 (grooves 42a) of the assembling jig 41 such that the Dumet electrode 3 to which the Dumet electrode 3 faces downward (the external lead 9 faces upward). In this manner, the Dumet electrode 3 is fitted in the hole of the glass tube 4a. The semiconductor element 6 is sandwiched by the Dumet electrodes 2 and 3. As needed, the Dumet electrode 3 is applied with load by using a pressurizer (not shown) to press the Dumet electrodes 2 and 3 to the semiconductor element 6.

The assembling jig 41 on which the Dumet electrodes 2 and 3, the semiconductor element 6, and the glass tube 4a are set as shown in FIG. 9 is put into a heating device (heating furnace) (not shown) for glass sealing to heat the assembling jig 41 to a predetermined temperature. In this manner, the glass tube 4a is melted to fuse the glass tube 4a on the outer peripheral surfaces of the Dumet electrodes 2 and 3. After the heating, the assembling jig 41 is cooled (slowly cooled) to harden the glass tube 4a, thereby obtaining the glass sealing member 4. In this manner, the members are fixed, and the semiconductor device 1 in FIG. 1 is manufactured. Since the glass sealing member 4 is adhesively bonded (fused or sealed) to the outer peripheries of the Dumet electrodes 2 and 3, the semiconductor element 6 located between the Dumet electrode 2 and the Dumet electrode 3 is airtightly sealed. The manufactured semiconductor device 1 is removed from the assembling jig 41, and a test for checking the polarity of the semiconductor device 1 is performed to discriminate the anode of the semiconductor device 1 from the cathode thereof, and marking is performed as needed. In the step of mounting the semiconductor device 1 on a wiring board, the external leads 8 and 9 are connected to the wiring pattern of the wiring board through soldering or the like.

FIG. 10 is an explanatory diagram (table) showing the characteristics of glass used in the glass sealing member 4 (glass tube 4a). In FIG. 10, a glass material $G_1$ having a relatively high softening point (glass softening point or softening temperature) and a glass material (low-melting glass) $G_2$ having a relatively low softening point (glass softening point or softening temperature) are shown. The softening point of the glass material $G_2$ is lower than that of the glass material $G_1$, the sealing temperature (adhesive sealing temperature, temperature in glass sealing, or temperature of a furnace in glass sealing) can be lowered.

As described above, in the glass sealing step, the glass sealing member 4 (glass tube 4a) is fused on the outer peripheral surfaces of the Dumet electrodes 2 and 3 by heating. With the sealing at this time, the metal film 27 of the metal electrode 30 of the semiconductor element 6 reacts with the epitaxial layer 22 to enhance silicification, and the thickness of the silicide layer 28 may increase. The enhancement of silicification functions to increase a current (leakage current) in the opposite direction of the semiconductor element 6 serving as a Schottky barrier diode. For this reason, in a heat treatment step for silicification of the lower part of the metal film 27 performed after the metal film 27 is formed, even if a heat-treatment temperature is set depending on requested diode characteristics to control the degree of silicification (thickness of the silicide layer 28), the silicification of the metal film 27 is enhanced by heating in the glass sealing step, and the diode characteristics may be different from the request values. This may decreases the manufacturing yield of semiconductor devices and may increase the manufacturing cost of the semiconductor devices. For this reason, the glass sealing temperature is preferably set to be low as far as possible.

When the glass sealing temperature is high, compression stress or tensile stress increases, the adhesive property (reliability of electric connection) between the semiconductor element 6 and the Dumet electrodes 2 and 3 may be deteriorated. The reliability of the electric connection between the semiconductor element 6 and the Dumet electrodes 2 and 3 may be deteriorated not only when the semiconductor element 6 is a Schottky barrier diode but also when the semiconductor element 6 is a PN junction diode (for example, a PN switching diode, a zener diode, or the like) which does not use a metal electrode forming a Schottky barrier. This may decrease the manufacturing yield of semiconductor devices and may increase the manufacturing cost of the semiconductor devices. For this reason, the glass sealing temperature is preferably set to be low as far as possible.

However, according to the studies by the present inventors, it was found that the adhesive property between the glass sealing member (glass tube) and the Dumet electrode may be poor when the glass sealing temperature is lowered by using a low-melting-point glass (or glass having a low softening point). This may deteriorate the tensile strength between the glass sealing member and the Dumet electrode (Dumet wire) and may cause a decrease in manufacturing yield of semiconductor devices and an increase in manufacturing cost of the semiconductor device.

FIG. 11 is an explanatory diagram (table) showing ratios of the copper layers in the Dumet electrodes 2 and 3 used in the semiconductor device 1 according to the embodiment and a nickel (Ni) content (nickel ratio or nickel content) of the core portion 11. In FIG. 11, not only the Dumet electrodes 2 and 3 according to the embodiment but also a Dumet electrode (Dumet wire) $D_{CE}$ are shown.

As shown in FIG. 11, in the semiconductor device 1 according to the embodiment, in the Dumet electrode 2 and the Dumet electrode 3 to be used, ratios of the copper layers 12 are 20 wt % or more each (with respect to the respective Dumet electrodes 2 and 3). According to the studies by the present inventors, the following fact was understood. That is, when the proportions (ratios) of the copper layers 12 of the Dumet electrodes 2 and 3 in the Dumet electrodes 2 and 3 are controlled, even though a glass sealing temperature is lowered by using glass having a relatively low melting point (low softening point) as the material of the glass sealing member 4 (glass tube 4a), the adhesive property between the glass sealing member 4 and the electrodes 2 and 3 is improved to make it possible to improve the tensile strength. In the embodiment, the ratios of the copper layers 12 in the Dumet electrodes 2 and 3 are 20 wt % or more each. However, when the ratios of the copper layers 12 in the Dumet electrodes 2 and 3 preferably fall within the range of 20 to 25 wt %, and more preferably fall within the range of 21 to 24 wt %. In other words, in the embodiment, a Dumet wire in which a ratio of the copper layer 12 is 20 wt % or more is used to form the Dumet electrodes 2 and 3, a Dumet wire in which a ratio of the copper layer 12 falls within the range of 20 to 25 wt % is more preferably used to form the Dumet electrodes 2 and 3, and a Dumet wire in which a ratio of the copper layer 12 falls within the range of 21 to 24 wt % is still more preferably used to form the Dumet electrodes 2 and 3. A thickness $t_2$ of the copper layer 12 is more preferably larger than a thickness (height) $t_1$ of the bump electrode 34 (bump electrode 7a) of the semiconductor element 6.

Figure 12:
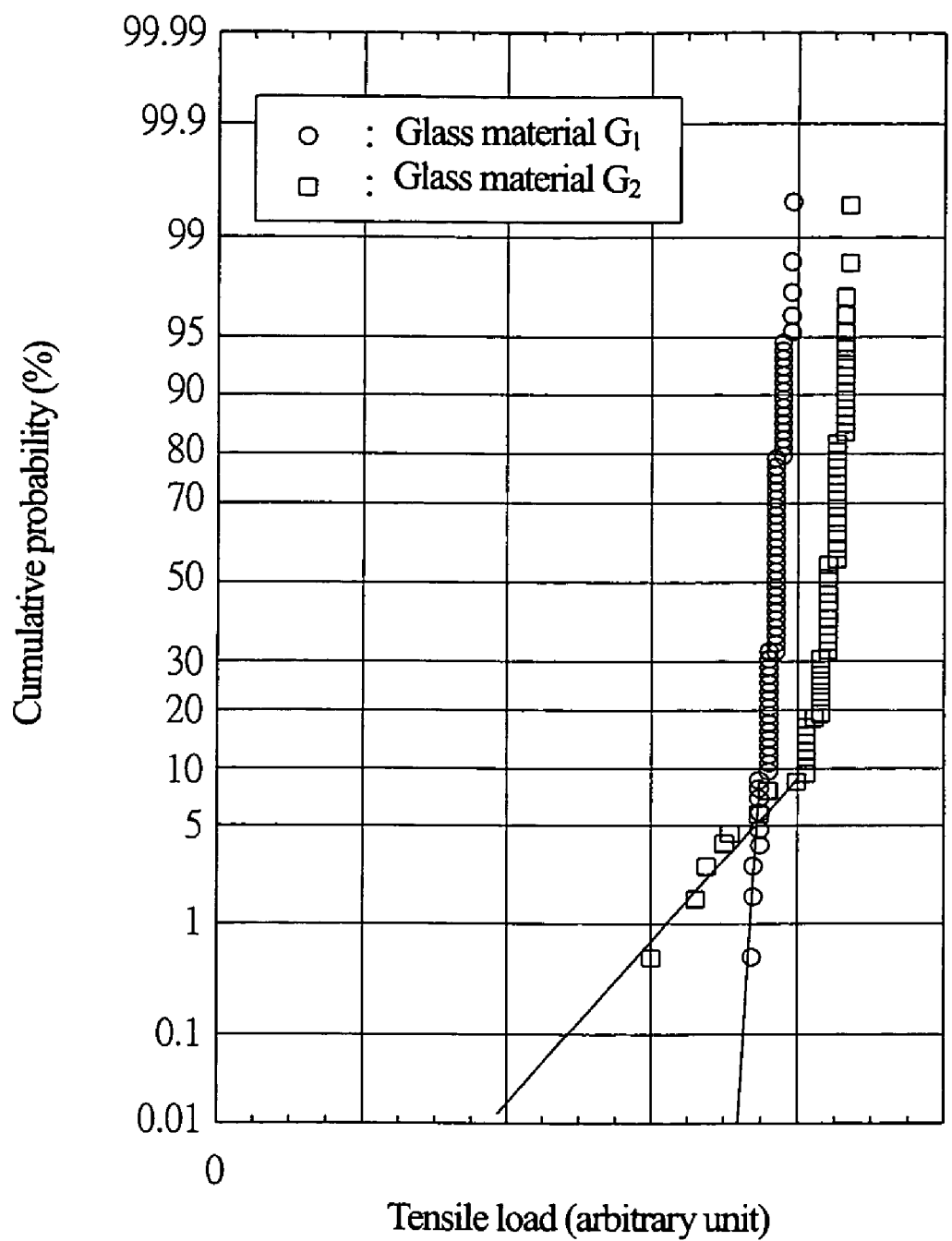
FIG. 12 is a graph showing a result of a tensile strength test of a semiconductor device using a Dumet electrode of a comparative example.

FIG. 12 is a graph showing a result of the tensile strength test of a semiconductor device (glass-sealed type diode) using a Dumet electrode $D_{CE}$ of a comparative example shown in FIG. 11 in place of the Dumet electrodes 2 and 3. In the graph in FIG. 12, a case in which the glass material $G_1$ in FIG. 10 is used as the glass sealing member 4 (glass tube 4a) and a case in which the glass material $G_2$ is used as the glass sealing member 4 are shown. In the tensile strength test, a load was applied to the external lead 8 (or the external lead 9), and the degree of applied load at which a defective (separation of the glass sealing member 4 from the Dumet electrode $D_{CE}$) occurs was measured with respect to a plurality of samples (semiconductor devices). The abscissa in FIG. 12 corresponds to a tensile load (arbitrary unit), and the ordinate in FIG. 12 corresponding to a cumulative probability of defective samples.

As shown in FIG. 12, when glass sealing is performed at a relatively high sealing temperature by using the glass material $G_1$ having a relatively high softening point to manufacture a semiconductor device (glass-sealed type diode) (corresponding to a blank circle in FIG. 12), the adhesive property between the glass sealing member 4 and the Dumet electrode $D_{CE}$ is relatively good, and the probability of causing defects by a low tensile load is relatively low. However, when glass sealing is performed at a relatively low sealing temperature by using the glass material $G_2$ having a relatively low softening point (low melting point) to manufacture a semiconductor device (glass-sealed type diode) (corresponding to a blank square in FIG. 12), the adhesive property between the glass sealing member 4 and the Dumet electrode $D_{CE}$ becomes poor, and the probability of causing defects even at a relatively low tensile load increases. This deteriorates the reliability of the semiconductor device (glass-sealed type diode) and decreases the manufacturing yield of semiconductor devices.

Figure 13:
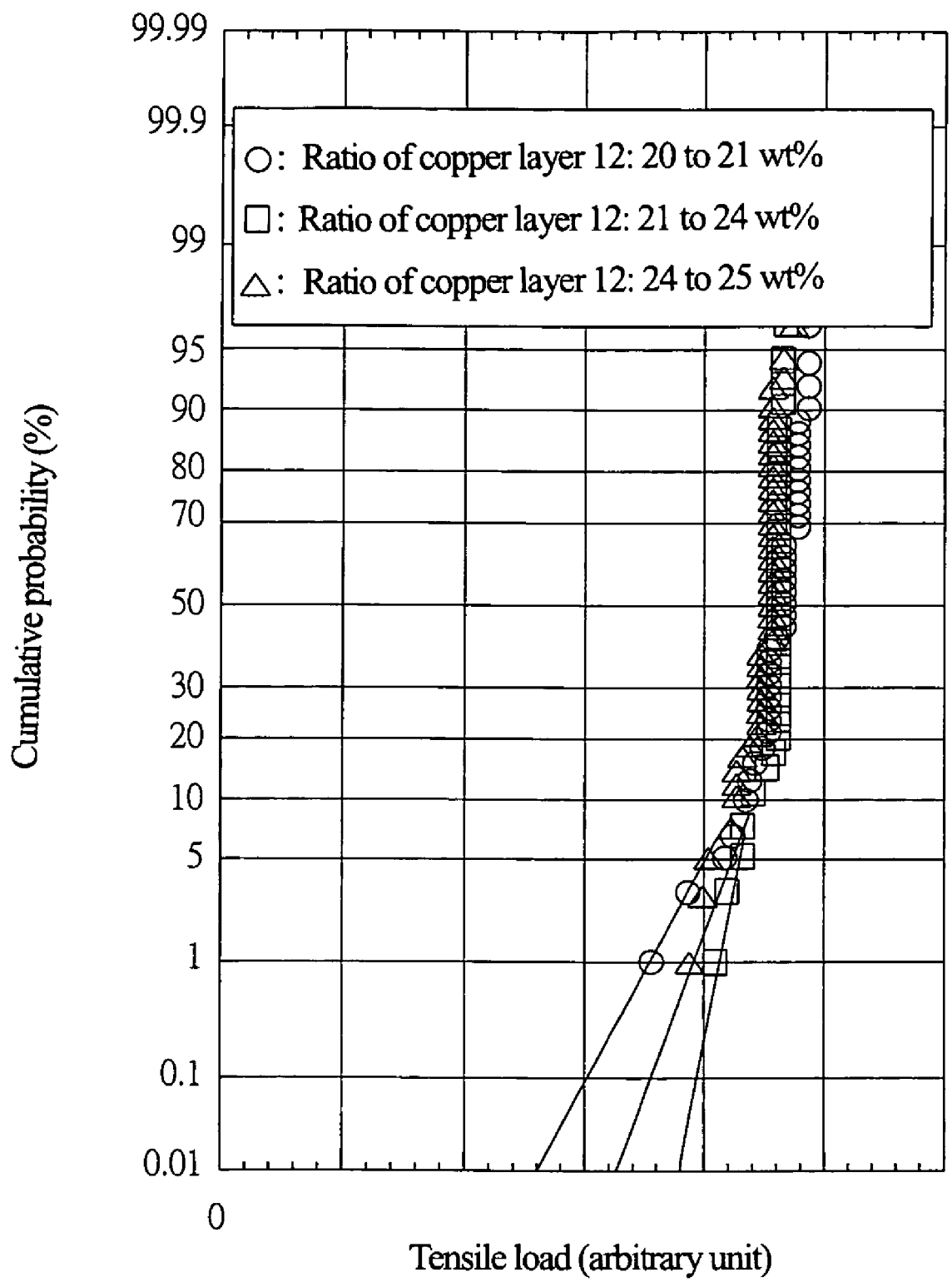
FIG. 13 is a graph showing a result of a tensile strength test of the semiconductor device using the Dumet electrode according to an embodiment of the present invention.

FIG. 13 is a graph showing a result of a tensile strength test of the semiconductor device 1 using the Dumet electrodes 2 and 3 according to the embodiment. In the graph in FIG. 13 shows a case in which the glass material $G_2$ having a relatively low softening point (low melting point) is used as the glass sealing member 4 (glass tube 4a. The graph in FIG. 13 shows a case in which the ratios of the copper layers 12 in the Dumet electrodes 2 and 3 fall within the range of 20 to 21 wt %, a case in which the ratios fall within the range of 21 to 24 wt %, and a case in which the ratios fall within the range of 24 to 25 wt %. In the tensile strength test, a load was applied to the external lead 8 (or the external lead 9), and the degree of applied load at which a defective (separation of the glass sealing member 4 from the Dumet electrodes 2 and 3) occurs was measured with respect to a plurality of samples (semiconductor devices 1). The abscissa in FIG. 13 corresponds to a tensile load (arbitrary unit), and the ordinate in FIG. 13 corresponding to a cumulative probability of defective samples.

As shown in FIG. 13, the Dumet electrodes 2 and 3 according to the embodiment in which the ratios of the copper layers 12 are larger than that of the Dumet electrode $D_{CE}$ are used to make it possible to improve the adhesive property (adhesive strength) between the glass sealing member 4 and the Dumet electrodes 2 and 3, to increase the tensile strength, and to decrease the probability of causing defects at a low tensile load. The effect of the improvement in adhesive property between the glass sealing member 4 and the Dumet electrodes 2 and 3 can be obtained when the ratios of the copper layers 12 of the Dumet electrodes 2 and 3 are set at 20 wt % or more of the Dumet electrodes 2 and 3, respectively.

In this manner, even though glass (for example, the glass material $G_2$) having a relatively low softening point (low melting point) is used as the material of the glass sealing member 4 (glass tube 4a) to lower the glass sealing temperature, the adhesive property between the glass sealing member 4 and the Dumet electrodes 2 and 3 can be improved, and the tensile strength between the glass sealing member 4 and the Dumet electrodes 2 and 3 can be improved. For this reason, the probability of causing defects at a low tensile load can be reduced. Therefore, the reliability of the semiconductor device 1 can be improved, and the manufacturing yield of semiconductor devices 1 can be improved. The manufacturing cost of the semiconductor device 1 can also be reduced. Since the adhesive property (adhesive strength) between the glass sealing member 4 and the Dumet electrodes 2 and 3 can be improved, the contact state between the bump electrode 7a or the rear electrode 7b of the semiconductor element 6 and the Dumet electrodes 2 and 3 can be improved. For this reason, the contact areas between the bump electrode 7a or the rear electrode 7b of the semiconductor element 6 and the Dumet electrodes 2 and 3 can also be reduced, and the semiconductor element 6 or the semiconductor device 1 can be easily reduced in size. In addition, a ratio of open defects can also be reduced in a surge test.

The ratios of the copper layers 12 in the Dumet electrodes 2 and 3 preferably fall within the range of 20 to 25 wt % of the Dumet electrodes 2 and 3, and more preferably, fall within the range of 21 to 24 wt %. In this manner, as shown in FIG. 13, the adhesive property (adhesive strength) between the glass sealing member 4 and the Dumet electrodes 2 and 3 is more improved to improve the tensile strength between the glass sealing member 4 and the Dumet electrodes 2 and 3, so that the probability of causing defects at a low tensile load can be more reduced. For this reason, the reliability of the semiconductor device 1 can be more improved.

According to the studies by the present inventors, when glass (for example, the glass material $G_2$) having a relatively low softening point (low melting point) is used as the material of the glass sealing member 4 (glass tube 4a) to lower the glass sealing temperature, the metal electrode 30 (metal film 27) of the semiconductor element 6 can be suppressed or prevented from being silicified in the glass sealing step, and it is confirmed that the characteristics of the semiconductor element 6 can be suppressed or prevented from changing (varying). In this manner, the electric characteristics of the manufactured semiconductor device 1 are stabilized. It is confirmed that the manufacturing yield of semiconductor devices are considerably improved comparing with that obtained when glass (for example, the glass material $G_1$) having a relatively high softening point is used.

According to the studies by the present inventors, the nickel contents (nickel ratios) of the core portions 11 of the Dumet electrodes 2 and 3 are preferably set at 45 wt % or less. As shown in FIG. 11, the nickel contents of the core portions 11 preferably fall within the range of 41 to 43 wt %. When the nickel contents of the core portions 11 of the Dumet electrodes 2 and 3 are set to the above-mentioned values, the adhesive property (adhesive strength) between the glass sealing member 4 and the Dumet electrodes 2 and 3 can be more improved when the glass sealing temperature is lowered by using the glass material (for example, the glass material $G_2$) having a relatively low softening point (low melting point). For this reason, the tensile strength between the glass sealing member 4 and the Dumet electrodes 2 and 3 can be more improved, and the probability of causing defects at a low tensile load can be more reduced. Therefore, the reliability of the semiconductor device 1 can be more improved.

Figure 14:
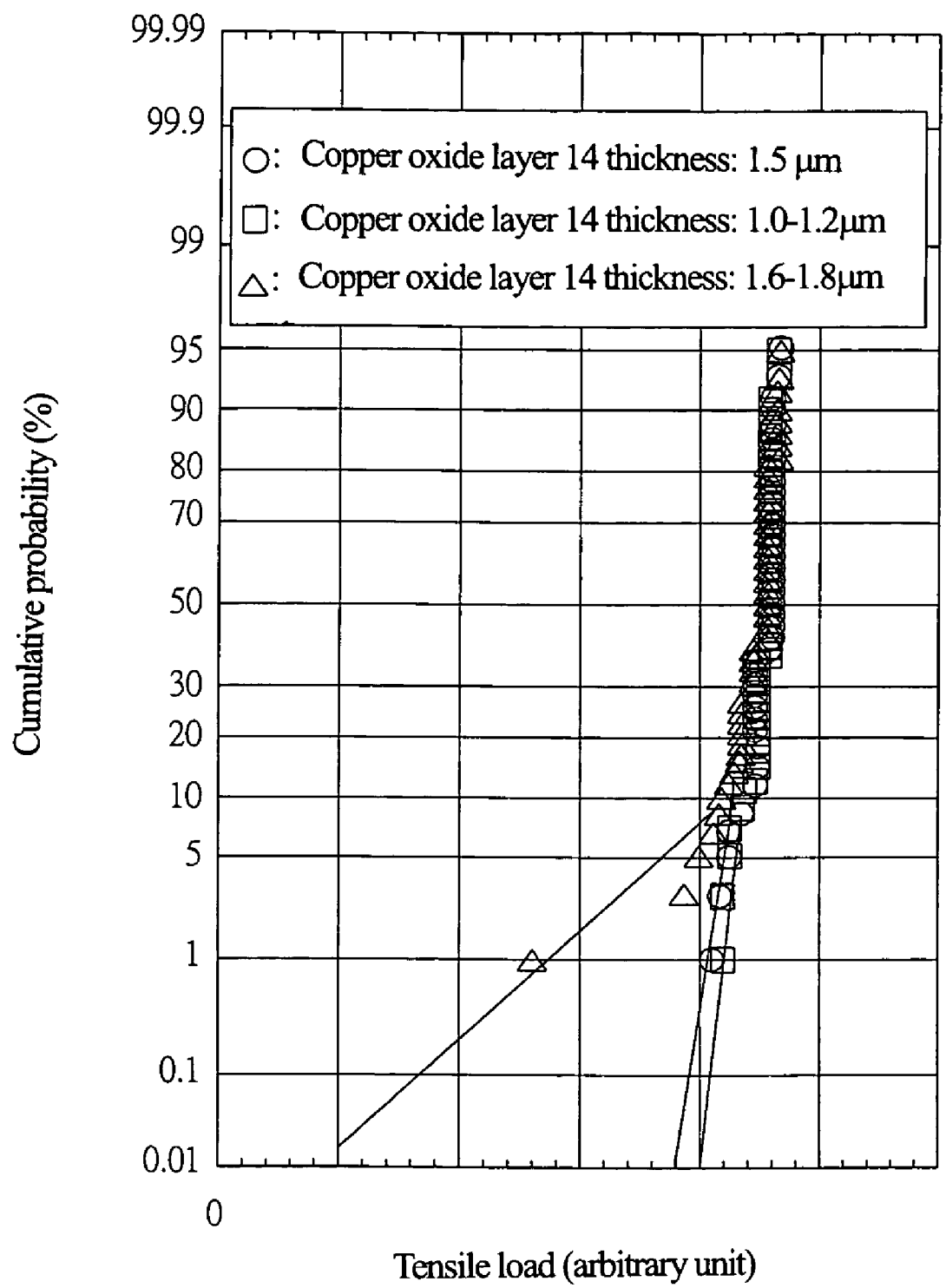
FIG. 14 is a graph showing a result of a tensile strength of a semiconductor device when a copper oxide layer in the Dumet electrode is changed in thickness.

The present inventors have also studied the relationship between the adhesive property between the glass sealing member 4 and the Dumet electrodes 2 and 3 and the thickness of the copper oxide layers 14 in the Dumet electrodes 2 and 3. FIG. 14 is a graph showing a result of a tensile strength test of the semiconductor device 1 when the thickness of the copper oxide layers 14 of the Dumet electrodes 2 and 3 are changed. The graph in FIG. 14 shows a case in which the glass material $G_2$ having a relatively low softening point (low melting point) is used as the glass sealing member 4 (glass tube 4a to set the thickness of the copper oxide layers 14 of the Dumet electrodes 2 and 3 at 1.0 to 1.2 μm, a case in which the thickness of the copper oxide layers 14 are set at 1.5 μm, and the thickness of the copper oxide layers 14 are set at 1.6 to 1.8 μm. In this embodiment, the thickness of the copper oxide layers 14 of the Dumet electrodes 2 and 3 correspond to the thickness of the copper oxide layers 14 obtained before the glass sealing step is performed. The abscissa in FIG. 14 corresponds to a tensile load (arbitrary unit), and the ordinate in FIG. 14 corresponds to a cumulative probability of defective samples.

As is apparent from FIG. 14, the thickness of the copper oxide layers 14 of the Dumet electrodes 2 and 3 are set at 1.5 μm or less to improve the adhesive property (adhesive strength) between the glass sealing member 4 and the Dumet electrodes 2 and 3 and to improve the tensile strength, so that the probability of causing defects at a low tensile load can be reduced. In this manner, even though glass (for example, the glass material $G_2$) having a relatively low softening point (low melting point) is used as the material of the glass sealing member 4 (glass tube 4a) to lower the glass sealing temperature, the adhesive property between the glass sealing member 4 and the Dumet electrodes 2 and 3 can be improved, the tensile strength between the glass sealing member 4 and the Dumet electrodes 2 and 3 can be improved, and the probability of causing defects at a low tensile load can be reduced. Therefore, the reliability of the semiconductor device 1 can be more improved, and the manufacturing yield of semiconductor devices 1 can be more improved. The manufacturing cost of the semiconductor device 1 can also be reduced.

In the embodiment, as described above, the glass-sealed type semiconductor device 1 is manufactured by using the Dumet electrode 2 and the Dumet electrode 3 in which the ratios of the copper layers 12 are 20 wt % or more, more preferably, fall within the range of 20 to 25 wt %, and still more preferably, fall within the range of 21 to 24 wt %. Since the Dumet electrodes 2 and 3 are used, even though a glass material having a low softening point (low melting point) is used as the material of the glass sealing member 4 to lower a glass sealing temperature, the adhesive property between the glass sealing member 4 and the Dumet electrodes 2 and 3 is not deteriorated. For this reason, the reliability of the semiconductor device can be improved, and the range of a softening point of a glass material which can be used as the glass sealing member 4 (glass tube 4a) becomes wide, and the selection of glass materials is extensive. Therefore, the degree of freedom of the steps in manufacturing a semiconductor device increases, and the semiconductor can be easily manufactured. The manufacturing cost of the semiconductor device can also be reduced.

In the embodiment, since the adhesive property between the glass sealing member 4 and the Dumet electrodes 2 and 3 can be secured, a glass sealing temperature can be lowered by using a glass material (for example, the glass material $G_2$ or the like) having a low softening point (low melting point). For example, the sealing temperature of the glass sealing member 4 (glass tube 4a) in the glass sealing step is preferably set at a temperature at which silicification (reaction between the metal film 27 and the epitaxial layer 22) of the metal film 27 (metal electrode 30) is not enhanced. The sealing temperature (adhesive sealing temperature) is more preferably set at 630° C. or less (set temperature of the furnace), and still more preferably set at 620° C. or less. The softening point (glass softening point) of the glass sealing member 4 (glass tube 4a) is more preferably set at 560° C. or less, and still more preferably set at 552° C. or less. A glass material having a low softening point (low melting point) is used to lower the glass sealing temperature, so that the metal film 27 of the metal electrode 30 of the semiconductor element 6 and the epitaxial layer 22 are suppressed or prevented from reacting to each other and being silicified. For this reason, after the semiconductor element 6 is manufactured, the characteristics (for example, electric characteristics such as forward or backward current characteristics) of the semiconductor element 6 can be suppressed or prevented from changing (varying). Therefore, glass-sealed type semiconductor devices (Schottky barrier diodes) having desired characteristics can be stably manufactured at a high yield. The manufacturing cost of the semiconductor devices can be reduced. Since the sealing temperature in the glass sealing step is relatively higher than an ambient temperature of the semiconductor substrate 21 (metal film 27) in the step of forming the semiconductor element 6, a low glass sealing temperature is very effective to stabilize the electric characteristics of the glass-sealed type semiconductor device (Schottky barrier diode).

Silicification (reaction to the epitaxial layer 22) of the metal film 27 (metal electrode 30) is easily enhanced when tungsten is used as the material of the metal film 27 (the reaction easily occurs at a relatively low temperature). For this reason, when the glass sealing temperature cannot be lowered, as the material of the metal film 27 (metal electrode 30), only a metal material which cannot be easily silicified must be selected. In the embodiment, even though the glass sealing temperature is lowered, the adhesive property between the glass sealing member 4 and the Dumet electrodes 2 and 3 can be secured. For this reason, the glass sealing can be performed even at a low temperature, and the metal material such as tungsten the silicification of which is not enhanced can be used as the material of the metal electrode 30(metal film 27) of the Schottky barrier diode. For this reason, the selection of glass materials is extensive, and semiconductor devices (Schottky barrier diodes) having various characteristics can be manufactured.

When the glass sealing temperature is high, compression or tensile stress increases, and the adhesive property (the reliability of electric connection) between the semiconductor element 6 and the Dumet electrodes 2 and 3 may be deteriorated. However, in the embodiment, since a glass sealing temperature can be lowered by using a glass material having a low softening point (low melting point), the reliability of the electric connection between the semiconductor element 6 and the Dumet electrodes 2 and 3 can be improved.

In the embodiment, the securement (improvement) of the adhesive property between the glass sealing member 4 and the Dumet electrodes 2 and 3, the prevention of the variation of characteristics (electric characteristics) of the semiconductor device, and the securement (improvement) of the reliability of the electric connection between the semiconductor element 6 and the Dumet electrodes 2 and 3 can be compatible.

In the above embodiment, as the material of the glass sealing member 4 (glass tube 4a), lead glass containing lead as shown in FIG. 10 is used. As another embodiment, glass (lead-free glass) which is free from lead can also be used as the material of the glass sealing member 4 (glass tube 4a). In this manner, contamination or the like caused by lead can be prevented. In addition, semiconductors can be more easily manufactured.

Second Embodiment

In the first embodiment, a Schottky barrier diode is used as the semiconductor element 6 glass-sealed in the semiconductor device 1. In the second embodiment, a diode element except for a Schottky barrier diode, e.g., a semiconductor element (semiconductor chip) constituted by a diode element using a PN junction is used in place of the semiconductor element 6.

FIGS. 15 to 18 are main sectional views of steps in manufacturing a semiconductor element (semiconductor chip) 6a used in the semiconductor device according to the embodiment.

Figure 15:
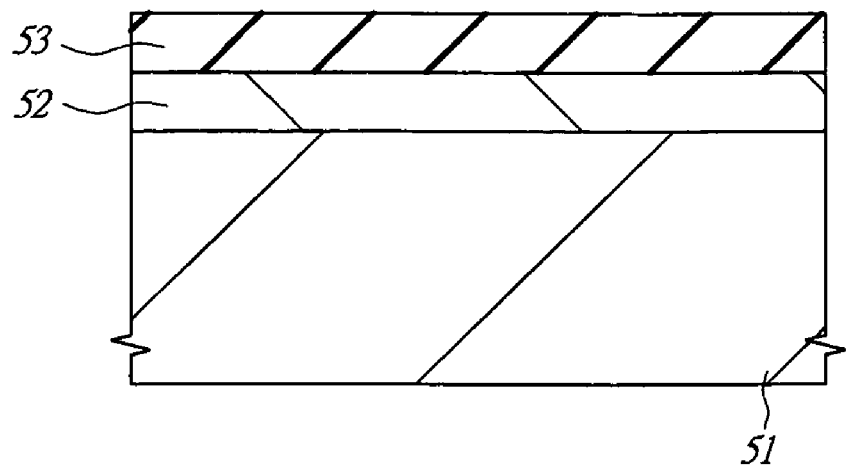
FIG. 15 is a main sectional view of a step in manufacturing a semiconductor element used in a semiconductor device according to another embodiment of the present invention.

As shown in FIG. 15, a semiconductor substrate semiconductor wafer) 51 comprised of $n^+$-type silicon in which an impurity (for example, arsenic (As) or phosphor (P)) having an n-type conductivity is doped at a high concentration is prepared. An epitaxial layer (epitaxial silicon layer) 52 having an $n^-$-type conductivity is formed on the semiconductor substrate 51 by using a vapor-phase growth (epitaxial growth). An impurity (for example, arsenic (As) or phosphor (P)) having an n-type conductivity is doped in the epitaxial layer 52. The film thickness of the epitaxial layer 52 is, e.g., about several μm to several ten μm.

A silicon oxide film 53 is formed on the surface of the epitaxial layer 52 by using thermal oxidation or the like.

Figure 16:
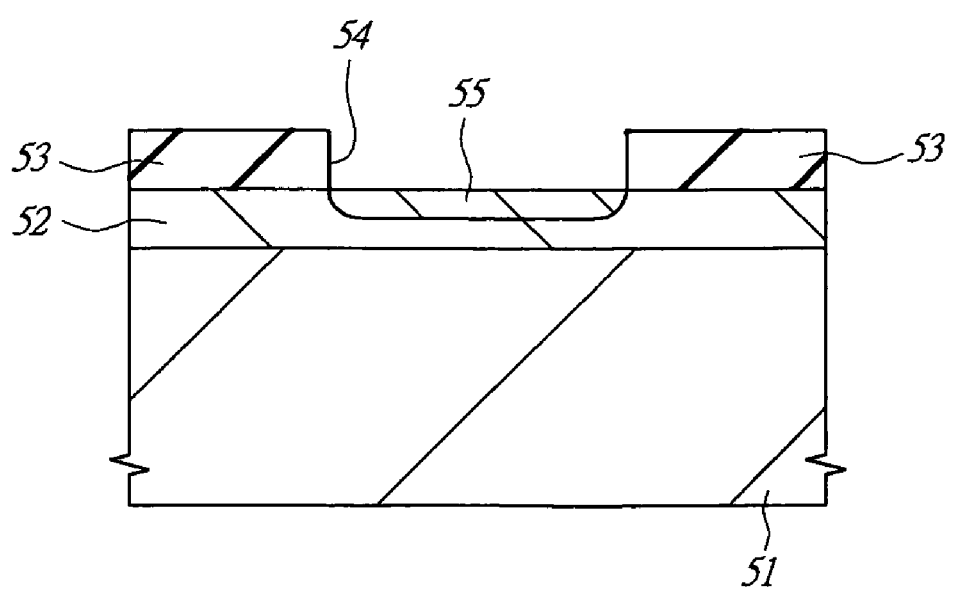
FIG. 16 is a main sectional view of a step in manufacturing the semiconductor element subsequent to the step in FIG. 15.

As shown in FIG. 16, the silicon oxide film 53 is selectively removed by using photolithography or dry etching to form an opening 54 reaching the epitaxial layer 52. Thereafter, an impurity (for example, boron (B)) having a p-type conductivity is doped in the epitaxial layer 52 by using the silicon oxide film 53 as a mask by ion implantation or the like, and thermal treatment is performed as needed. In this manner, a p-type diffusion layer (p-type impurity diffusion layer or p-type semiconductor region) 55. After this manner, a PN (P/N) junction between the p-type diffusion layer 55 and the n-type epitaxial layer 52 is formed.

Figure 17:
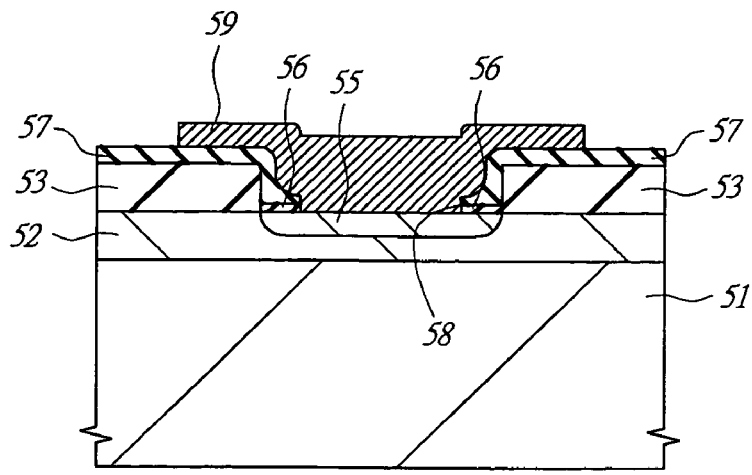
FIG. 17 is a main sectional view of a step in manufacturing the semiconductor element subsequent to the step in FIG. 16.

As shown in FIG. 17, an oxide film 56 is formed by using thermal oxidation on the surface to which the p-type diffusion layer 55 is exposed. A silicon oxide ($SiO_2$) film is deposited on the semiconductor substrate 51, and a PSG (Phosphor Silicate Glass) film is deposited on the surface of the silicon oxide film by, e.g., a CVD method, to form a surface protecting film 57 constituted by the silicon oxide film and the PSG film.

The oxide film 56 and the surface protecting film 57 are selectively removed by photolithography and dry etching to form an opening (contact hole) 58. At this time, the p-type diffusion layer 55 is exposed on the bottom of the opening 58.

A conductor (metal) film comprised of a metal material such as tungsten (W), titanium (Ti), chromium (Cr), silver (Ag), or palladium (Pd) having a work function depending on the size of a Schottky barrier to be formed is deposited on the semiconductor substrate 51 (surface protecting film 57) including the inside of the opening 58 by, e.g., a sputtering method. The conductor film is patterned by using photolithography and dry etching to form a surface electrode 59.

Figure 18:
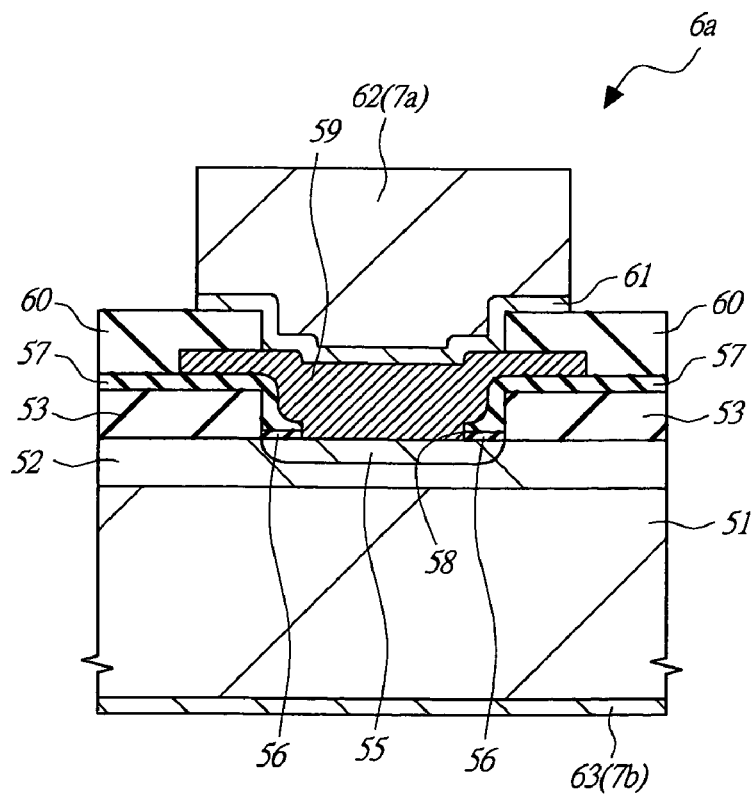
FIG. 18 is a main sectional view of a step in manufacturing the semiconductor element subsequent to the step in FIG. 17.

As shown in FIG. 18, a silicon nitride film and a silicon oxide film are deposited on the semiconductor substrate 51 are sequentially deposited to form a surface final protecting film 60 constituted by the silicon nitride film and the silicon oxide film. The surface final protecting film 60 is selectively removed by using photolithography and dry etching to expose the surface of the surface electrode 59.

Like the bump electrode underlying film 33 and the bump electrode 34 according to the first embodiment, a bump electrode underlying film 61 and a bump electrode 62 (corresponding to the-bump electrode 7a) are formed on the surface electrode 59.

After the lower surface of the semiconductor substrate 51 is ground as needed to thin the semiconductor substrate 51, like the back side electrode 35 of the first embodiment, a back side electrode (corresponding to a cathode electrode, i.e., the back side electrode 7b) 63. Thereafter, the semiconductor substrate 51 is cut (diced) into independent semiconductor elements (semiconductor chips) to form a semiconductor element 6a serving as a PN junction diode element.

Figure 19:
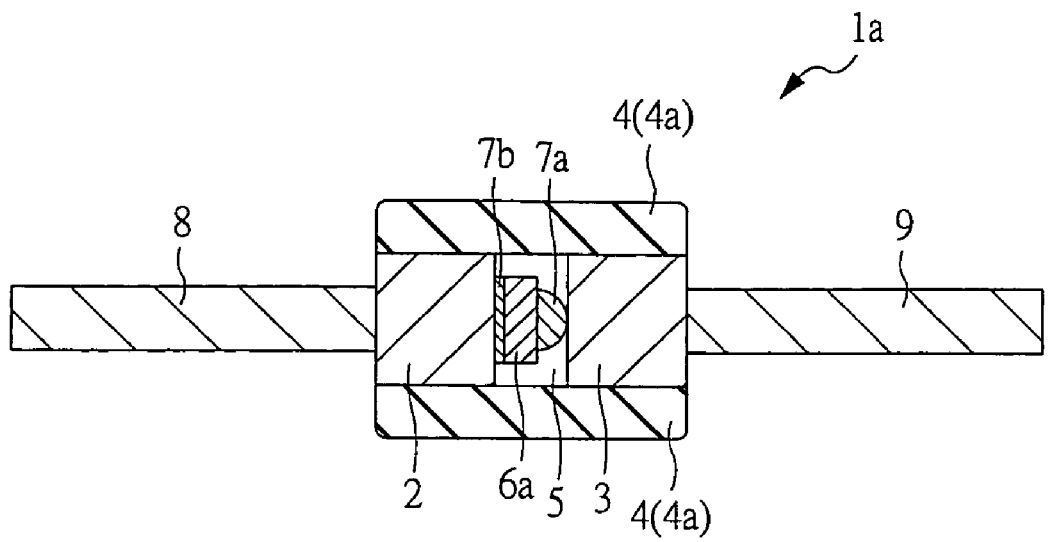
FIG. 19 is a sectional view of a semiconductor device according to still another embodiment of the present invention.

By using the semiconductor element 6a manufactured as described above, as in the first embodiment, a semiconductor device 1a according to the second embodiment is manufactured. FIG. 19 is a sectional view of the semiconductor device 1a of the embodiment, and corresponds to FIG. 1.

As shown in FIG. 19, the semiconductor device 1a of the embodiment is a glass-sealed type semiconductor device, e.g., a glass-sealed type diode. In the semiconductor device 1a, a semiconductor element (semiconductor chip) 6a is tightly sealed (sealed) in a cavity 5 constituted by Dumet electrodes 2 and 3 and a glass sealing member (glass tube or glass sleeve) 4. External leads 8 and 9 are connected to the Dumet electrodes 2 and 3, respectively. The semiconductor element 6a is a diode having a PN junction therein as described above. The semiconductor device 1a has almost the same configuration as that of the semiconductor device 1 of the first embodiment except that the semiconductor element 6a is used in place of the semiconductor element 6, a description of the configuration (for example, the Dumet electrodes 2 and 3, the glass sealing member 4, and the external leads 8 and 9) except for the configuration of the semiconductor element 6a will be omitted.

When a glass-sealed semiconductor device is manufactured by using the semiconductor element 6a as described above, a high glass sealing temperature increases compression or tensile stress, and the adhesive property (reliability of electric connection) between the semiconductor element 6a and the Dumet electrodes 2 and 3 may be deteriorated. In the glass sealing step, the lower part of the surface electrode 59 reacts to the upper surface of the p-type diffusion layer 55 to cause silicification, and a defect (e.g., an increase in backward leakage current or the like) may occur. These detects may deteriorate the reliability of the semiconductor device. In the second embodiment, these problems can be solved by using the same Dumet electrodes 2 and 3 as used in the first embodiment. More specifically, as in the first embodiment, the adhesive property between the Dumet electrodes 2 and 3 and the glass sealing member 4 can be improved, and a glass sealing temperature can be lowered by using a glass material having a low softening point (low melting point) as the glass sealing member 4. For this reason, the reliability of the electric connection between the semiconductor element 6a and the Dumet electrodes 2 and 3 can be improved. The lower part of the surface electrode 59 and the upper surface of the p-type diffusion layer 55 can be suppressed or prevented from reacting to each other, and a defect (e.g., an increase in backward leakage current) caused by silicification of the lower part of the surface electrode 59 can be prevented. Therefore, the reliability of the semiconductor device 1a can be improved. The manufacturing yield of semiconductor devices can be increased, and the manufacturing cost of the semiconductor devices can be reduced.

Third Embodiment

In the first and second embodiments, diodes are used as the semiconductor elements 6 glass-sealed in the semiconductor device 1. In this embodiment, a semiconductor element (semiconductor chip) except for the diode is used in place of the semiconductor element 6.

Figure 20:
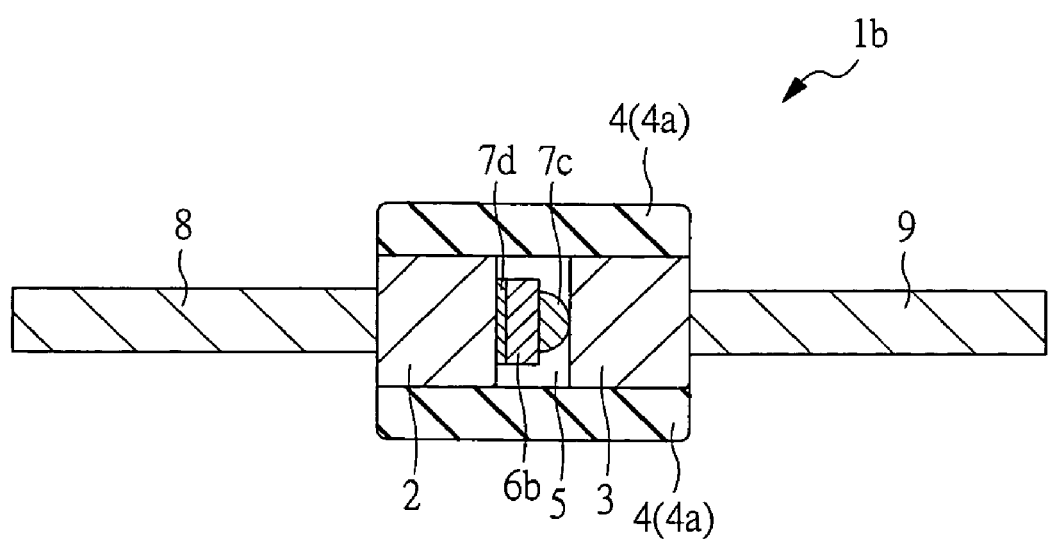
FIG. 20 is a sectional view of a semiconductor device according to still another embodiment of the present invention.

FIG. 20 is a sectional view of a semiconductor device 1b according to the embodiment, and corresponds to FIG. 1.

As shown in FIG. 20, the semiconductor device 1b of the embodiment is a glass-sealed type semiconductor device, and can function as a non-contact type electronic tag having, e.g., a microwave receiving antenna. In the semiconductor device 1b, a semiconductor element (semiconductor chip) 6b is airtightly sealed (enclosed) in a cavity 5 constituted by Dumet electrodes 2 and 3 and a glass sealing member (glass tube or glass sleeve) 4. External leads 8 and 9 are connected to the Dumet electrodes 2 and 3, respectively. The semiconductor device 1b has almost the same configuration as that of the semiconductor device 1 of the first embodiment except that the semiconductor element 6b is used in place of the semiconductor element 6, a description of the configuration (for example, the Dumet electrodes 2 and 3, the glass sealing member 4, and the external leads 8 and 9) except for the configuration of the semiconductor element 6b will be omitted.

Figure 21:
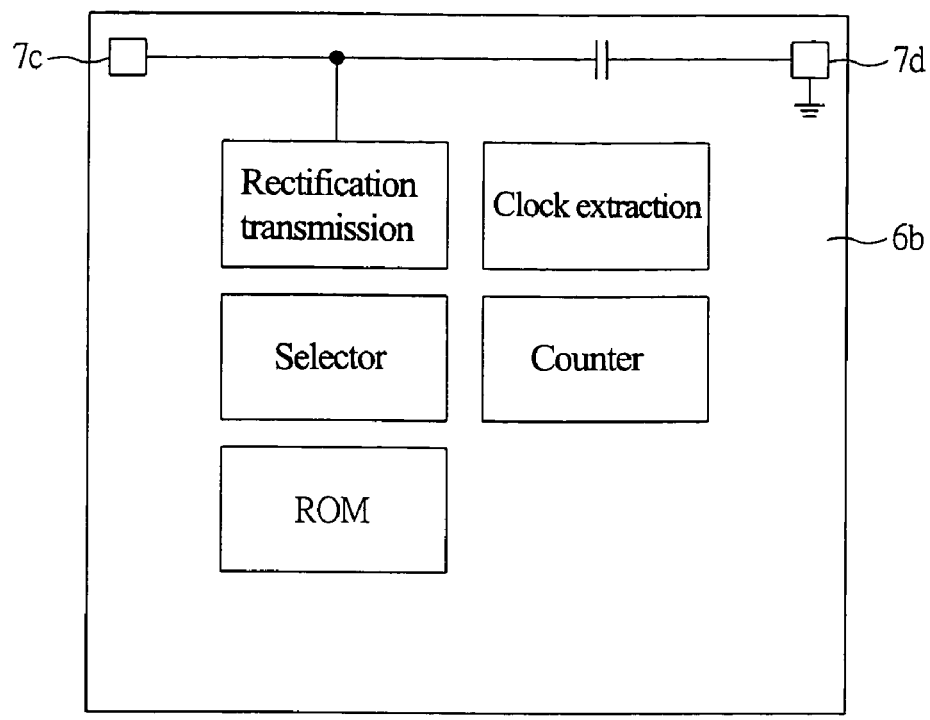
FIG. 21 is a block diagram showing the circuit configuration of a semiconductor element.

FIG. 21 is a block diagram (explanatory diagram) showing a circuit configuration of the semiconductor element (semiconductor chip) 6b. The semiconductor element 6b comprises a single-crystal silicon having, e.g., vertical length×horizontal length=0.3 mm×0.4 mm and a thickness of about 0.15 mm. Circuits for rectification, transmission, clock extraction, a selector, a counter, a ROM, and the like are formed in an element forming region on a major surface of the semiconductor element 6b. On the outside of the element forming region, a bonding pad (not shown) is formed.

The ROM has a 128-bit memory capacity to make it possible to store data the amount of which is larger than that of data stored in a tag using a bar code. The data stored in the ROM is advantageously difficult to be dishonestly altered in comparison with data stored as a bar code.

In the element forming region on the major surface of the semiconductor element (semiconductor chip) 6b, a bump electrode (surface electrode) 7c is formed. The Dumet electrodes 3 is electrically connected to the bump electrode 7c. The bump electrode 7c is connected to a circuit shown in FIG. 21 through a bonding pad formed at a peripheral portion (region except for the element forming region) on the major surface of the semiconductor element (semiconductor chip) 6b. A back side electrode 7d is formed on the lower surface of the semiconductor element 6b. The Dumet electrode 2 is electrically connected to the back side electrode 7d. Therefore, the bump electrode 7c of the semiconductor element 6b is electrically connected to the external lead 9 through the Dumet electrode 3, and the back side electrode 7d of the semiconductor element 6b is electrically connected to the external lead 8 through the Dumet electrode 2. In the embodiment, the external lead 8 or the external lead 9 can function as a microwave receiving antenna. The lengths of the external leads 8 and 9 can be optimized such that a microwave or the like having a frequency of, e.g., 2.45 GHz can be efficiently received. In this manner, the semiconductor element 6b can be operated by receiving high-frequency electromagnetic wave energy through the external leads 8 and 9 serving as antennas.

In the embodiment, the same Dumet electrodes 2 and 3 as in the first embodiment to make it possible to improve the adhesive property between the Dumet electrodes 2 and 3 and the glass sealing member 4 as in the first and second embodiments, and a glass sealing temperature can be lowered by using a glass material having a low softening point (low melting point) as the glass sealing member 4. For this reason, compression or tensile stress generated by a change in temperature in the glass sealing step can be suppressed, and the reliability of the electric connection between the semiconductor element 6b and the Dumet electrodes 2 and 3 can be improved. Therefore, the reliability of the semiconductor device 1b can be improved. The manufacturing yield of semiconductor devices can be improved, and the manufacturing cost of the semiconductor devices can be reduced.

Fourth Embodiment

In the first embodiment, the semiconductor device 1 has the external leads 8 and 9 as external electrodes (external terminals). A semiconductor device according to the fourth embodiment comprises external electrodes (external terminals) having flat surfaces in place of the external leads 8 and 9, so that surface mounting can be achieved.

Figure 22:
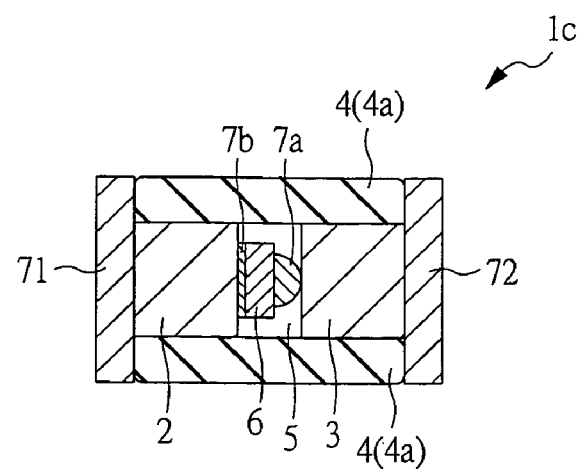
FIG. 22 is a sectional view of a semiconductor device according still another embodiment of the present invention.

FIG. 22 is a sectional view of a semiconductor element 1c according to this embodiment, and corresponds to FIG. 1 of the first embodiment.

The semiconductor element 1c is a glass-sealed type semiconductor device as in the first embodiment, e.g., a glass-sealed type diode. As shown in FIG. 22, the semiconductor element 1c has Dumet electrodes (Dumet wires) 2 and 3 constituted by Dumet wires, a glass sealing member (glass tube or glass sleeve) 4, and a semiconductor element (semiconductor chip) airtightly sealed (enclosed) in a cavity 5 constituted by the Dumet electrodes 2 and 3 and the glass sealing member 4. The Dumet electrodes 2 and 3 and the semiconductor element 6 sandwiched by the Dumet electrode 2 and the Dumet electrode 3 are inserted into the tubular glass sealing member 4, and the glass sealing member 4 is fused on the outer peripheral surfaces of the Dumet electrodes 2 and 3.

In the semiconductor element 1c, unlike the semiconductor device 1 according to the first embodiment, no external leads are connected (welded) to the Dumet electrodes 2 and 3, and disk-like conductive portions 71 and 72 are connected (welded) to the Dumet electrodes 2 and 3 in place of the external leads, respectively. The conductive portions 71 and 72 have disk-like shapes having diameters larger than those of the Dumet electrodes 2 and 3, respectively. One surfaces of the conductive portions 71 and 72 are connected (welded) to the Dumet electrodes 2 and 3, respectively. The conductive portions 71 and 72 connected to the Dumet electrodes 2 and 3 are exposed from the glass sealing member 4, and can function as external electrode (external terminals) of the semiconductor element 1c. The conductive portions 71 and 72 serving as the external electrodes (external terminals) have flat exposed surfaces. When the semiconductor element 1c is mounted on a wiring board (not shown), the exposed surface of the conductive portion 71 or the conductive portion 72 are surface-mounted on the wiring pattern or the like on the wiring board.

When the semiconductor element 1c is manufactured, the Dumet electrodes 2 and 3 to which the conductive portions 71 and 72 are connected (welded) are prepared in advance. As in the first embodiment, the Dumet electrode 2 to which the conductive portion 71 is connected, the semiconductor element 6, the Dumet electrode 3 to which the conductive portions 71 and 72 is connected are inserted into the glass tube 4a (glass sealing member 4). The glass tube 4a is melted to be fused on the Dumet electrodes 2 and 3 and the conductive portions 71 and 72, and the glass tube 4a is sealed. The other configurations and the other manufacturing steps are the same as those in the first embodiment, a description thereof will be omitted.

In the embodiment, by using the same Dumet electrodes 2 and 3 as in the first embodiment, the same effect as in the first embodiment (e.g., improvement of reliability of a semiconductor device achieved by improvement of adhesive property between the Dumet electrodes 2 and 3 and the glass sealing member 4) can be achieved. In addition, the semiconductor element 1c of the embodiment can be surface-mounted on a wiring board or the like. For this reason, saving of a mounting area or the like can be achieved. The step of mounting the semiconductor element 1c on a wiring board or the like can be easily performed.

The invention made by the present inventors has been described above on the basis of the embodiments. However, the present invention is not limited to the embodiments, and various changes and modifications can be effected without departing from the spirit and scope of the invention.

An effect obtained by a typical one of the inventions disclosed in this application will be briefly described below.

A glass-sealed type semiconductor device is formed by using a Dumet wire in which a layer containing copper as a main component is 20 wt % or more, so that the reliability of the semiconductor device can be improved.

What is claimed is:

1. A semiconductor device comprising:
    first and second electrodes having layers containing copper as main components;
    a semiconductor element arranged between said first and second electrodes and electrically connected to said first and second electrodes; and a glass seating member which seals said first electrode, said semiconductor element, and said second electrode, wherein;
the semiconductor element includes a metal electrode,
the semiconductor element is a Schottky barrier diode,
the first and second electrodes are constituted by Dumet wires,
ratios of the layers in the first and second electrodes containing copper as main components fall within the range of 21 to 24 wt %,
said first and second electrodes have copper oxide layers formed on the outer peripheries of said layers containing copper as main components, the copper oxide layers contacting with said glass sealing member,
the thickness of said copper oxide layers is 1.5 μm or less at the time before said first and second electrodes are glass-sealed,
a sealing temperature of said glass sealing member is 630° C. or less and is a temperature at which silicification of said metal electrode of the semiconductor element is not enhanced, and
a glass softening point of said glass sealing member is 560° C. or less.

2. The semiconductor device according to claim 1, wherein said first and second electrodes have core portions and said layers containing copper as main components, said layers being formed on the outer peripheries of said core portions.

3. The semiconductor device according to claim 2, wherein the semiconductor element has a bump electrode, and wherein the thickness of said layers containing copper as main components formed around said core portions are larger than the height of said bump electrode.

4. The semiconductor device according to claim 2, wherein said core portions of said first and second electrodes comprise a nickel-containing alloy.

5. The semiconductor device according to claim 2, wherein said core portions of said first and second electrodes are comprised of a nickel-containing alloy having a nickel content of 45 wt % or less.

6. The semiconductor device according to claim 2, wherein said core portions of said first and second electrodes are comprised of a nickel-containing alloy having a nickel content falling within the range of 41 to 43 wt %.

7. The semiconductor device according to claim 2, wherein said core portions of said first and second electrodes are comprised of an alloy containing iron and nickel as main components.

8. The semiconductor device according to claim 1, wherein said semiconductor element comprises by a Schottky barrier diode having:
a semiconductor substrate;
an epitaxial layer formed on the semiconductor substrate; and
a metal electrode formed on the epitaxial layer.

9. The semiconductor device according to claim 8, wherein said metal electrode has a tungsten film.

* * * * *